United States Patent
Malik et al.

(10) Patent No.: US 6,449,756 B1
(45) Date of Patent: Sep. 10, 2002

(54) METHOD FOR ACCURATE AND EFFICIENT UPDATES OF TIMING INFORMATION LOGIC SYNTHESIS, PLACEMENT AND ROUTING FOR INTEGRATED CIRCUIT DESIGN

(75) Inventors: Sharad Malik, Princeton, NJ (US); Lawrence Pileggi, Pittsburgh, PA (US); Eric McCaughrin, Oakland, CA (US); Abhijeet Chakraborty, Sunnyvale, CA (US); Douglas B. Boyle, Palo Alto, CA (US)

(73) Assignee: Monterey Design Systems, Sunnyvale, CA (US)

( * ) Notice: Subject to any disclaimer, the term of this patent is extended or adjusted under 35 U.S.C. 154(b) by 0 days.

(21) Appl. No.: 09/094,542

(22) Filed: Jun. 12, 1998

(51) Int. Cl.$^7$ ................................................. G06F 17/50

(52) U.S. Cl. .................................... 716/6; 716/2; 716/4

(58) Field of Search ...................... 395/500.03, 500.07, 395/500.09, 500.1, 500.11, 500.12; 716/2, 6, 8, 10, 11, 1, 4

(56) References Cited

U.S. PATENT DOCUMENTS

| | | | | |
|---|---|---|---|---|
| 5,508,937 A | * | 4/1996 | Abato et al. | 395/500.07 |
| 5,581,473 A | | 12/1996 | Rusu et al. | 716/6 |
| 5,778,216 A | * | 7/1998 | Venkatesh | 713/503 |
| 5,877,965 A | * | 3/1999 | Hieter et al. | 395/500.07 |
| 5,980,093 A | * | 11/1999 | Jones et al. | 395/500.07 |
| 6,000,038 A | * | 12/1999 | Scepanovic et al. | 713/500 |

OTHER PUBLICATIONS

Swartz, W. and Sechen, C., "Timing Driven Placement for Large Standard Cell Circuits", Proceedings of the 32nd ACM/IEEE Conference on Design Automation, 1995, pp. 211–215, Jan. 1995.*

Lee, J. and Tang, D.T., "An Algorithm for Incremental Timing Analysis", Proceedings of the 32nd ACM/IEEE Conference on Design Automation, 1995, pp. 696–701, Jan. 1995.*

Wilson, Robert J., Introduction to Graph Theory, Third Edition, Longman Scientific & Technical, Hong Kong, 1986.*

Singh et al., "Timing Optimization of Combinational Logic", IEEE Proceedings of the International Conference on computer Aided Design, pp. 282–285 (1988).

Hitchcock, "Timing Verification and the Timing Analysis Program", IEEE, $19^{th}$ Design Automation Conference, 34.2:594–604 (1982).

* cited by examiner

Primary Examiner—Vythe Siek
(74) Attorney, Agent, or Firm—Vierra Magen Marcus Harmon & DeNiro LLP

(57) ABSTRACT

A timing graph representing timing information of an integrated circuit design may change after modifications are made to the integrated circuit design. The modifications change timing parameters for edges in the timing graph. The measure of these changes may be computed at a computed measure compared to a threshold. In the event the measure exceeds the threshold, the edges in the timing graph that need to change in response to the modifications are updated. Otherwise, the current edges in the timing graph are continued to be used. The threshold is set in accordance with the accuracy and efficiency requirements of an electronic design automation tool.

23 Claims, 6 Drawing Sheets

METHOD FOR ACCURATE AND EFFICIENT UPDATES OF TIMING INFORMATION LOGIC SYNTHESIS, PLACEMENT AND ROUTING FOR INTEGRATED CIRCUIT DESIGN

This application is related by subject matter to U.S. application Ser. No. 09/097,299 entitled METHOD FOR DESIGN OPTIMIZATION USING LOGICAL AND PHYSICAL INFORMATION, filed on even date herewith and incorporated herein by reference.

BACKGROUND OF THE INVENTION

1. Field of the Invention

The present invention relates to integrated circuit design and layout.

2. State of the Art

The design of integrated circuits follows several steps. The first step is designing the logical gate-level circuit that implements the function to be realized by the circuit (referred to as logic design or logic synthesis, of which logic optimizations are a key part). The next step is placing the gates (or cells) in a physical layout, and the final step is routing the interconnection between the cells. These steps may be done in sequence or possibly together. Typically the resulting design must meet certain timing constraints. Thus the logic synthesis, placement and routing steps need to ensure that these constraints are met. The constraints are met by monitoring how different parts of the circuit are contributing to the delay of the circuit using a data structure referred to as a timing graph. In addition to providing information about how the entire circuit is positioned with respect to meeting the timing constraints, the timing graph also provides information of how individual parts of the circuit affect the final timing result. Thus, the timing graph serves an important diagnostic function by pointing out which parts of the circuit may need modification in order for the circuit to meet the timing constraints.

Any modifications being made to the circuit in either the logic, the placement or the routing can result in a change of the timing properties of not just the part of the circuit modified, but also other parts of the circuit that this timing information can ripple through. This ripple effect may be felt through the entire circuit. Thus, the timing graph of the circuit needs to be updated to accurately reflect the impact of these changes. For large circuits, the number of times these modifications are made tends to be very high (many times the number of gates in the circuit). Thus, this updating step may need to be done a very large number of times, with each update possibly needing to update the entire timing graph. Consequently this update process can end up being too slow to enable designs to be completed in reasonable time.

Timing graphs have been used in integrated circuit design for many years. A conventional timing graph has edges from input pins of cells to their output pins, representing the delays of the cell, and edges from output pins of cells to input pins of succeeding cells, representing interconnect delay. U.S. Pat. No. 5,581,473 (assigned to Sun Microsystems), incorporated herein by reference, describes how a timing graph can be constructed using such edges.

The paper by Singh et al. in ICCAD 88 clearly describes the use of a slack graph in storing slack information. The use of the slack graph in incremental timing analysis is described in U.S. Pat. No. 5,508,937 entitled Incremental Timing Analysis (assigned to IBM), incorporated herein by reference. In incremental timing analysis, only the parts of the timing graph that need to be updated are updated. The foregoing patent describes updating the timing graph in response to multiple modifications. However, it does not actively defer the updates for a group of modifications until some suitable point.

SUMMARY OF THE INVENTION

This invention encompasses several distinct improvements to the existing updating process for the timing graphs. The first aspect deals with improving the accuracy of the information being represented by the timing graph. An improvement in the accuracy results in better accuracy for the timing properties of the design, as well as better diagnostic capability for identifying the parts of the design resulting in timing problems. In accordance with one embodiment of the invention, a timing graph model represents the delay from each input pin of a cell A to each input pin of the cells that the output of A is connected to. This graph is required to consider the impact of input pin selection on interconnect delay. Traditional timing graph models, on the other hand, represent the delay from the output pin of cell A to each input pin of the cells that A is connected to. While the latter representation is considered to be more concise, it is less accurate than the method of the present invention. The second aspect deals with improving the efficiency of the update process in response to modifications made in the design. In accordance with another embodiment of the invention, the accumulated results of many modifications are stored in a data structure specifically designed for this purpose before initiating an update of the timing graph. Since the timing graph is not updated after each modification, it may not provide accurate diagnostic capability. Using the aforementioned data structure, an algorithm carefully monitors the impact of the modifications on the diagnostic capabilities and initiates the update of the timing graph only when the diagnostic capabilities are in danger of being compromised. Thus it permits trade-offs between accuracy and computational requirements. One possible lazy update scheme for timing graphs is to initiate the update after a fixed number of modifications, or after a time when the total delay change in different parts of the circuit crosses a threshold. A suitable balance between accuracy and computational requirements is achieved. Lazy update becomes especially powerful when coupled with update techniques that take advantage of parallel processing capabilities. Various techniques for parallel update are described.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention may be used in conjunction with an electronic design automation placement tool. In accordance with an exemplary embodiment of one such placement tool, at each stage in cell placement, the cells are partitioned into a number of bins. Interconnection models for interconnects between bins and within bins provide both delay estimates for each interconnect in the circuit, as well as congestion estimates for each bin in the circuit. The circuit has timing constraints imposed on it that it needs to satisfy. The delay estimates of the interconnection, combined with the delays of the cells and the timing constraints imposed on the design, are converted to timing slack information for each part of the circuit. A negative timing slack indicates that that part of the circuit is not meeting the timing constraints. A positive slack indicates that that part of the circuit is producing its result faster than is needed and can thus be slowed down without violating its timing constraints. More generally, "slack" is defined herein as a measure of the degree to which a timing requirement is met in an integrated circuit design.

The circuits being considered follow a synchronous timing methodology. Thus the timing graph represents the combinational logic circuit between memory elements which are clocked. In a preferred embodiment, there is a one-to-one correspondence between input pins of gates in the circuit and nodes in the timing graph. An edge in the timing graph represents the signal path from the input pin of a gate to the input pin of its fanout gate. Delays are associated with edges. Thus for a gate with n input pins and m fanouts there will be n*m edges.

Figure 1A:
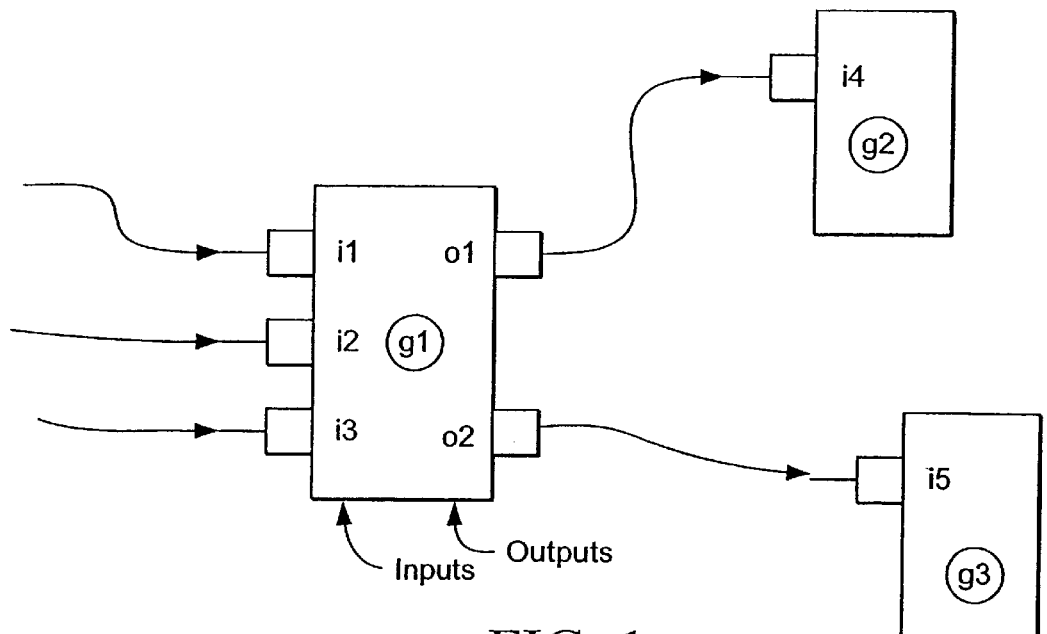
FIG. 1(a) is a diagram of a portion of an exemplary integrated circuit.
Figure 1B:
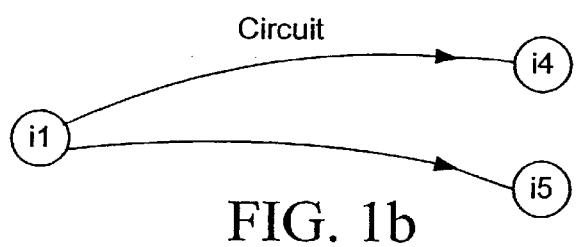
FIG. 1(b) is a portion of a timing graph used to represent timing information regarding the circuit of FIG. 1(a) in accordance with one aspect of the invention.

Referring more particularly to FIG. 1(*a*), a portion of an integrated circuit is shown, including a first gate g1, a second gate g2 and a third gate g3. The gate g1 has three inputs, i1, i2 and i3, and has two outputs, o1 that is connected to an input i4 of gate g2 and an output o2 that is connected to an input i5 of gate g3. In accordance with one aspect of the invention, timing information is represented in terms of the delay from one input of an integrated circuit element (gate or pin) to a succeeding input of a succeeding connected integrated circuit element (gate or pin). Referring to FIG. 1(*b*) therefore, showing a portion of a corresponding timing graph, a node representing the input i1 is connected by directed edges to nodes representing the inputs i4 and i5, respectively. Each edge has a delay value associated with it.

An alternative (and traditional) graph representation is to have nodes correspond to both input pins and output pins. An edge is present from an input pin of a gate to its output pin and also from its output pin to each of its fanouts. Again, delays are associated with edges. In this representation, for each gate, n+m edges are required.

The former representation (proposed by this invention) permits more accurate delay modeling. Since the number of fanins and fanouts of gates are bounded by small numbers, this representation does not have a significant complexity overhead, if at all. In fact, traversal of the graph tends to be faster.

In addition to delays, the timing graphs store additional information. One of the pieces of information is the slack at a node. The slack at a node reflects how that node is situated with respect to meeting the timing constraints imposed on the circuit. A negative slack implies that the timing constraints are not being met, with the magnitude of the slack indicating the magnitude of the violation. Parts of the circuit with negative slack are referred to as being critical. A positive slack indicates that the timing is being met, with the magnitude indicating the amount of time by which the result of that edge is available prior to its requirement. Thus the slack information serves as a diagnostic aid pointing to which parts of the circuit need work to meet the timing constraints and which parts are meeting the timing constraints with room to spare. This positive slack may then be used during placement and routing to move cells or route them with more delays than originally estimated, without violating the timing constraint.

Any modification in the circuit (logic, placement or routing) will result in the delay value along one or more edges changing. Consequently this will result in a change of slack, not just for nodes at each end of the edge, but also for nodes upstream and downstream in the timing graph. Potentially, this may include all the nodes in the timing graph, making slack updates a potentially expensive operation. This is exacerbated by the fact that updates will need to be done a very large number of times (typically many more times than the number of cells in the circuit).

Recall that the slack information tells what parts of the circuit need work to meet their timing constraints, and what parts have positive slack to use during placement. As long as this information remains reasonably accurate when it is needed, as the circuit is modified, updates could possibly be postponed until accuracy begins to be compromised. The following lazy update method accomplishes this balance of accuracy and computational cost.

Figure 2:
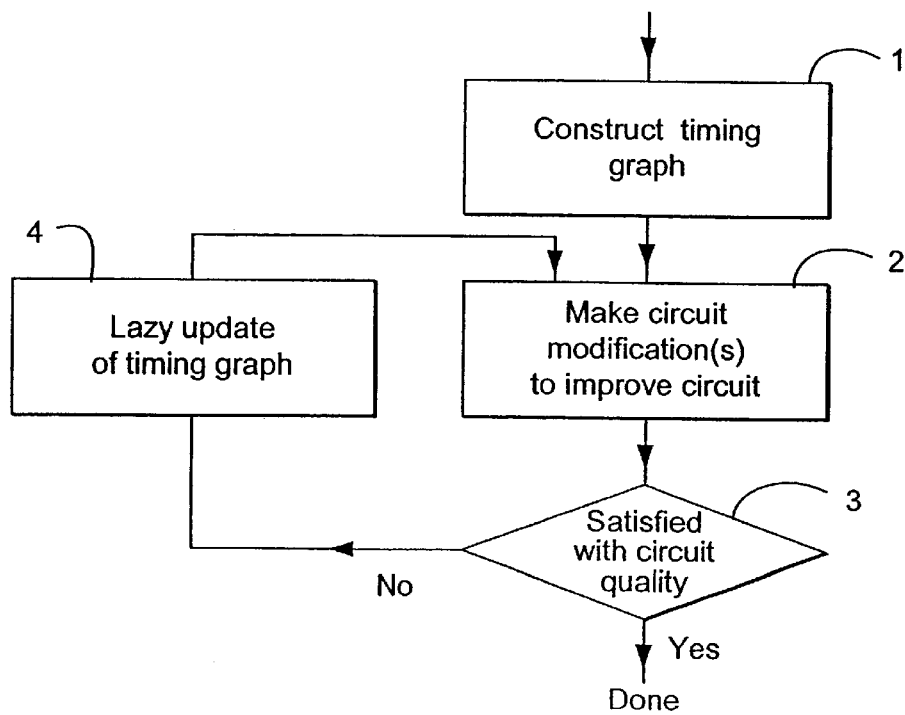
FIG. 2 is an overall flowchart of a lazy update method in accordance with one embodiment of the present invention.

Referring to FIG. 2, there is shown an overall flowchart of a lazy update method in accordance with one embodiment of the present invention. The method includes the following steps:

Construct a timing graph (Step 1). The timing graph may be conventional or may take the form of the timing graph of FIG. 1(*b*).

Make one or more modifications to the circuit (Step 2).

Depending on whether the circuit design is satisfactory (Step 3), either quit or proceed to Step 4.

Perform lazy update of the timing graph (Step 4). As described more fully hereinafter, in the lazy update method, a measure is computed of a need to update the timing graph to account for the modifications. When the measure exceeds a threshold, the timing graph is updated to account for the modifications. The threshold is set in accordance with accuracy and efficiency requirements of a electronic design automation tool.

Figure 3:
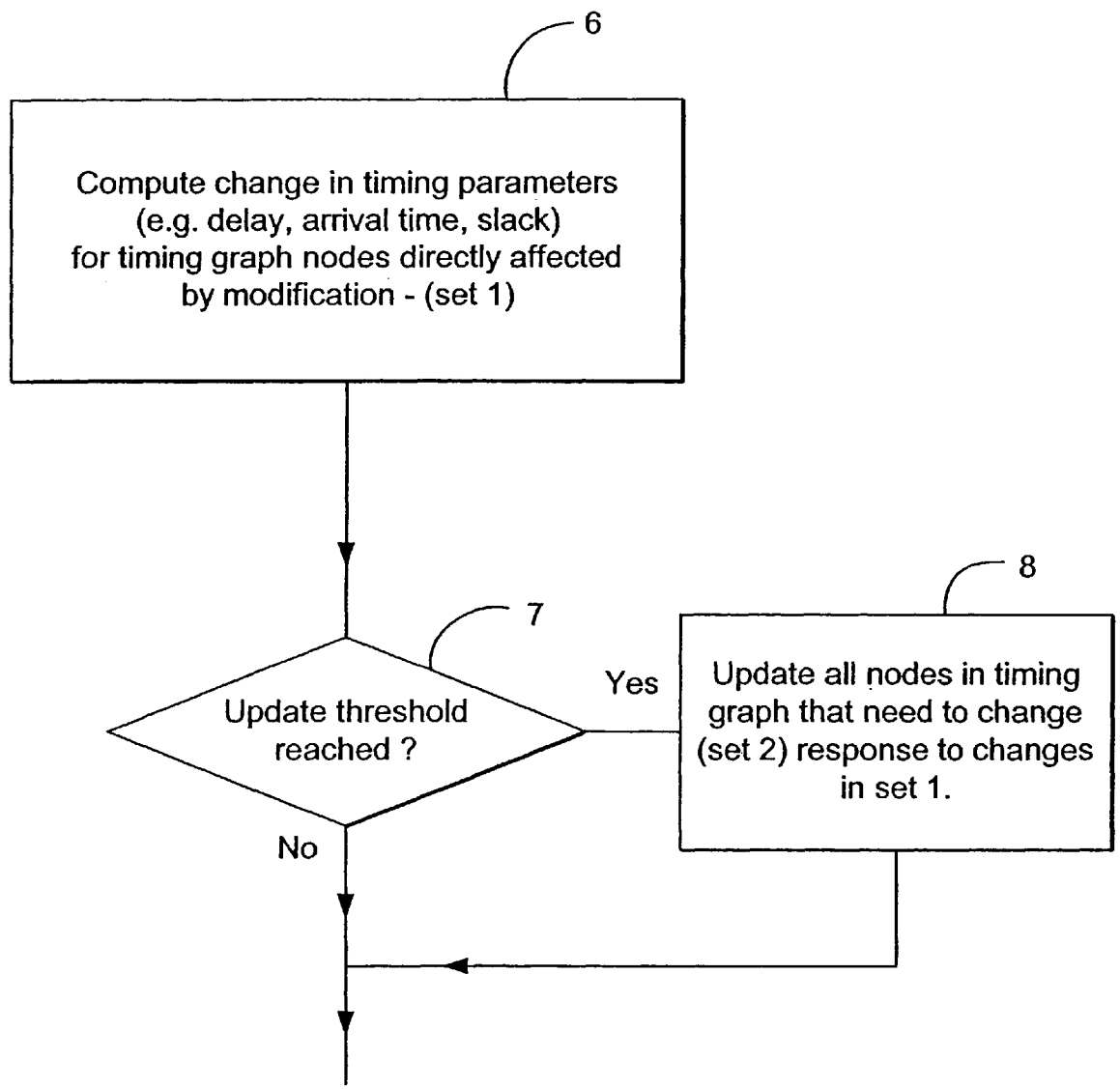
FIG. 3 is a more detailed flowchart of the lazy update step of the flowchart of FIG. 2.

Referring to FIG. 3, a more detailed flowchart of the lazy update step is shown. With respect to each modification, timing graph nodes include those nodes that are directly affected by the modification and those nodes that are indirectly affected. In Step 6, changes in timing parameters (e.g., delay, arrival time, slack) are captured for timing graph edges directly affect by a modification. A determination is then made whether an update threshold has been reached. If not, then no further timing graph updates are performed for the time being, and processing continues. If the update threshold has been reached, then all timing graph edges are updated that need to change in response to the changes in the first set of timing graph edges.

A suitable update threshold may be determined in various different ways. Three specific ways will be described. Many other way will be apparent to one of ordinary skill in the art.

Figure 4:
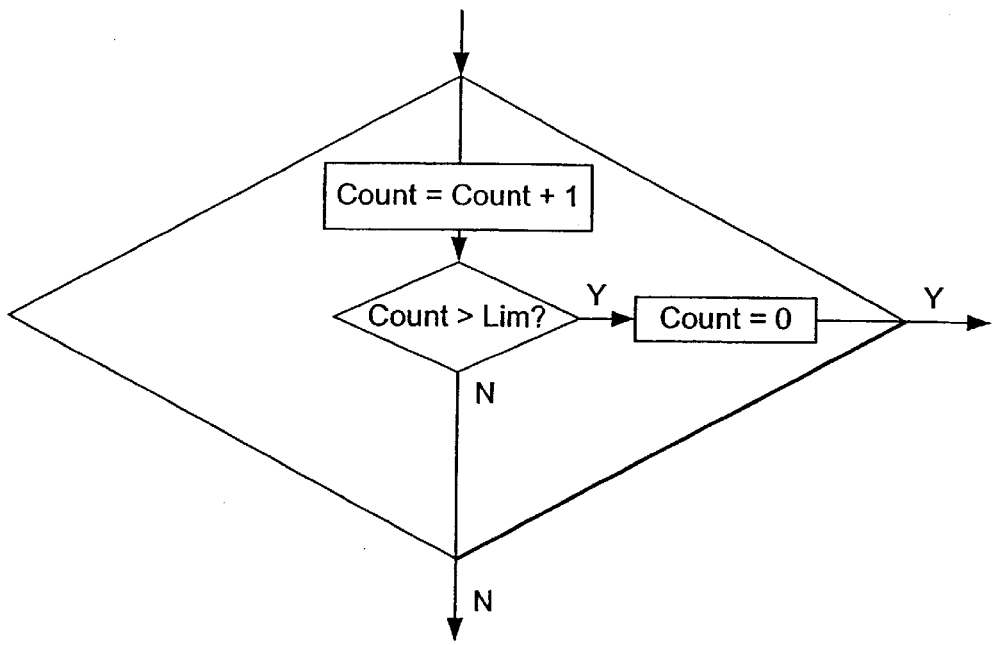
FIG. 4 is a more detailed flowchart of a portion of the flowchart of FIG. 3 in accordance with a first alternative embodiment.

Referring to FIG. 4, in accordance with a first exemplary alternative, each time a decision is to be made whether to update the timing graph (those edges indirectly affected by a modification), a counter is incremented. The count is then compared to a limit. If the count does not exceed the limit, then no update is performed. If the count does exceed the limit, then the counter is reset, and an update is performed as previously described.

Figure 5:
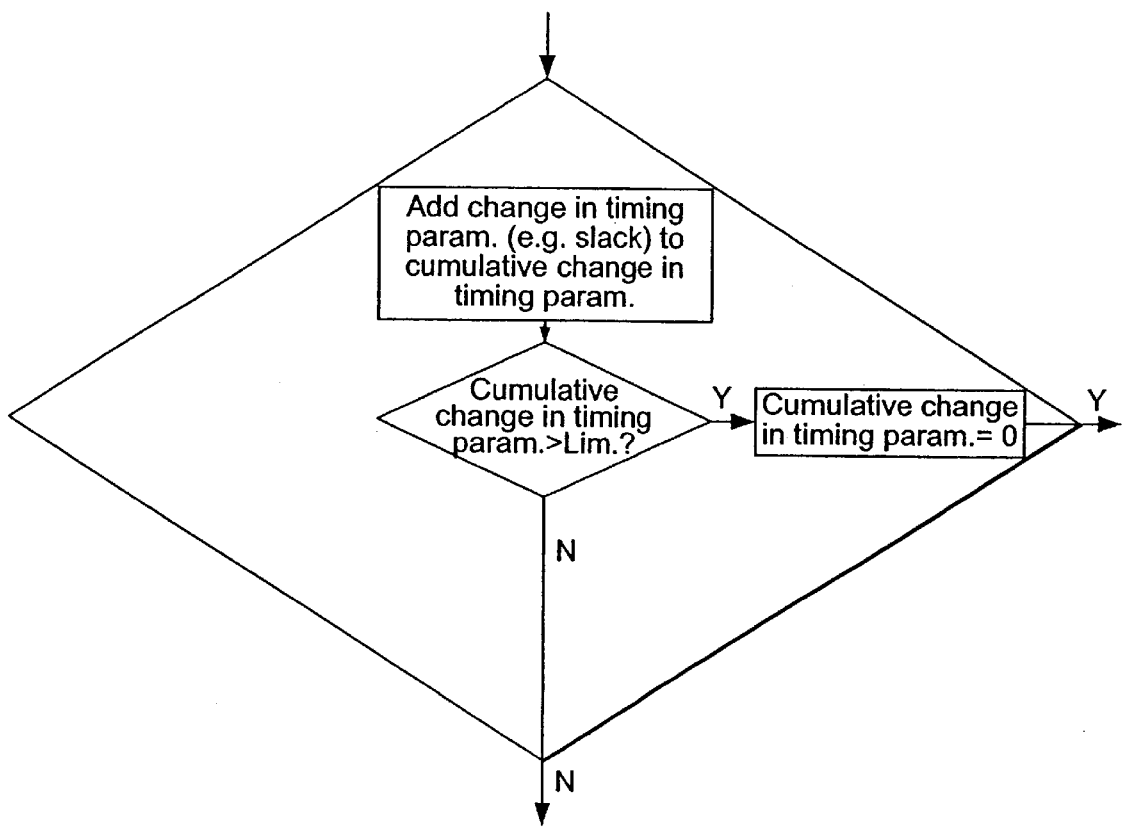
FIG. 5 is a more detailed flowchart of a portion of the flowchart of FIG. 3 in accordance with a second alternative embodiment.

Referring to FIG. 5, in accordance with a second exemplary alternative, changes to a particular timing parameter (e.g., slack) are accumulated for an edge directly affected by the changes. The cumulative change in the timing parameter is compared to a limit. If the cumulative change does not exceed the limit, then no update is performed. If the cumulative change does exceed the limit, then the cumulative change is set to zero, and an update is performed as previously described.

Figure 6:
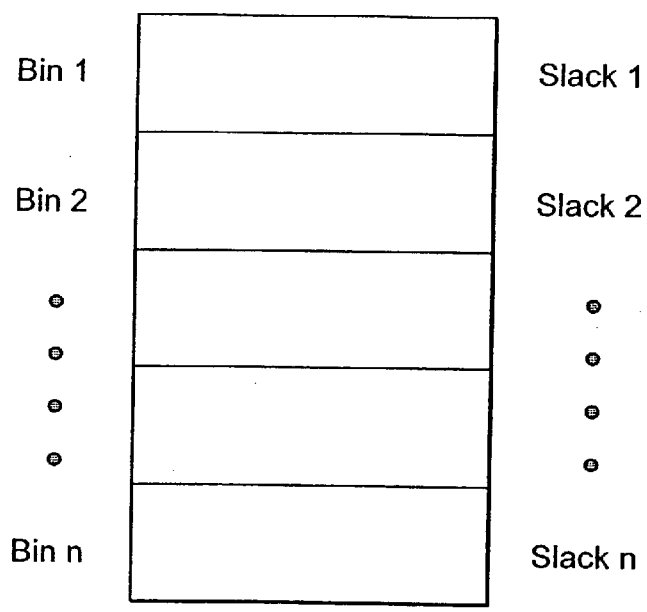
FIG. 6 is a diagram of a slack bin data structure used in conjunction with the embodiment of FIG. 7.

In accordance with a third exemplary alternative, each node on the timing graph is part of a slack bin based on its slack value. The range of slack values is partitioned into a number of bins (the number of bins determined experimentally). Each bin consists of all the nodes within a certain slack range. Further, within each bin, the nodes that are in a contiguous section in the circuit may be stored together in a node section (possibly stored as a list). This structure is illustrated in FIG. 6.

This data structure is used to perform the bookkeeping required to delay updates of the timing graph while maintaining the diagnostic power of the slacks. It is desirable to keep track of not only decreases in slack to know which sections are becoming critical, but also increases in slack to know which sections are becoming less critical. In critical sections of the circuit, a large number of circuit modifications may be required. Furthermore, it is crucial that these modifications be performed intelligently, since there is little or no room for error. In non-critical sections of the circuit, modifications are apt to be few, and the modifications are not crucial, leaving more room for error. The foregoing data structure enables this tracking to be done relatively easily.

Figure 7:
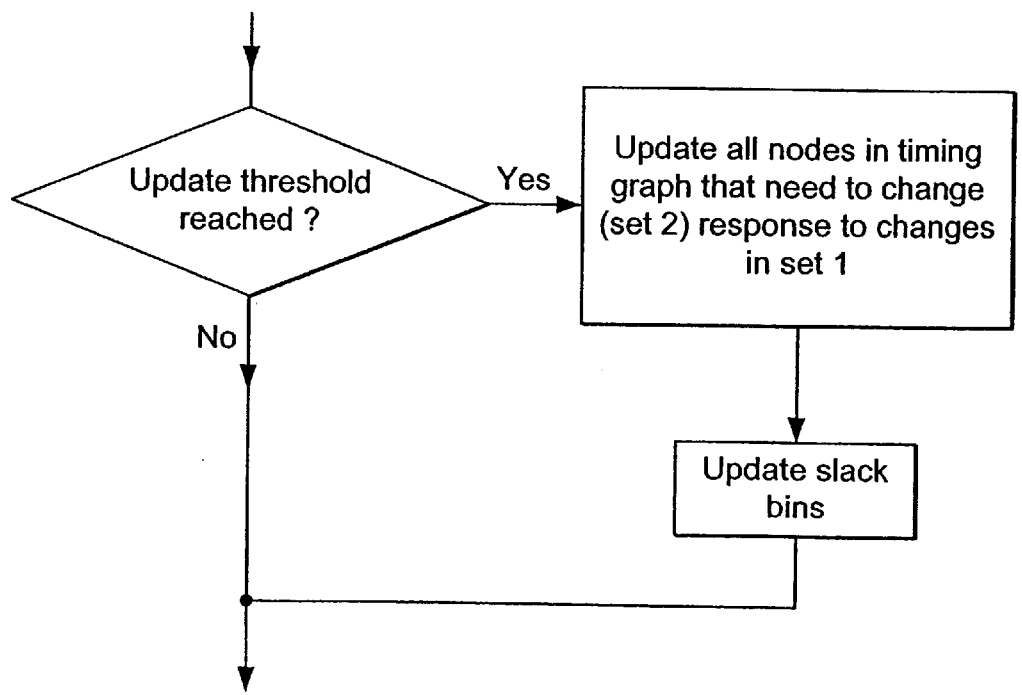
FIG. 7 is a more detailed flowchart of a portion of the flowchart of FIG. 3 in accordance with a third alternative embodiment.

Referring to FIG. 7, using slack bins, when a decision whether or not to update is made, a determination is made whether or not an update threshold using the slack bins has been reached. If not, then no update is performed. If so, then an update is performed as previously described. Furthermore, the slack bins are updated.

In a relatively simple scheme, different update thresholds may be set for different bins. Other more complicated methods may also be followed.

The present invention may be embodied in various forms, including computer-implemented methods, computer systems configured to implement such methods, computer-readable media containing instructions for implementing such methods, etc. Examples of computer-implemented methods embodying the invention have been described. Reducing such methods to tangible form as computer-readable media may be accomplished by methods well-known in the art.

Figure 8:
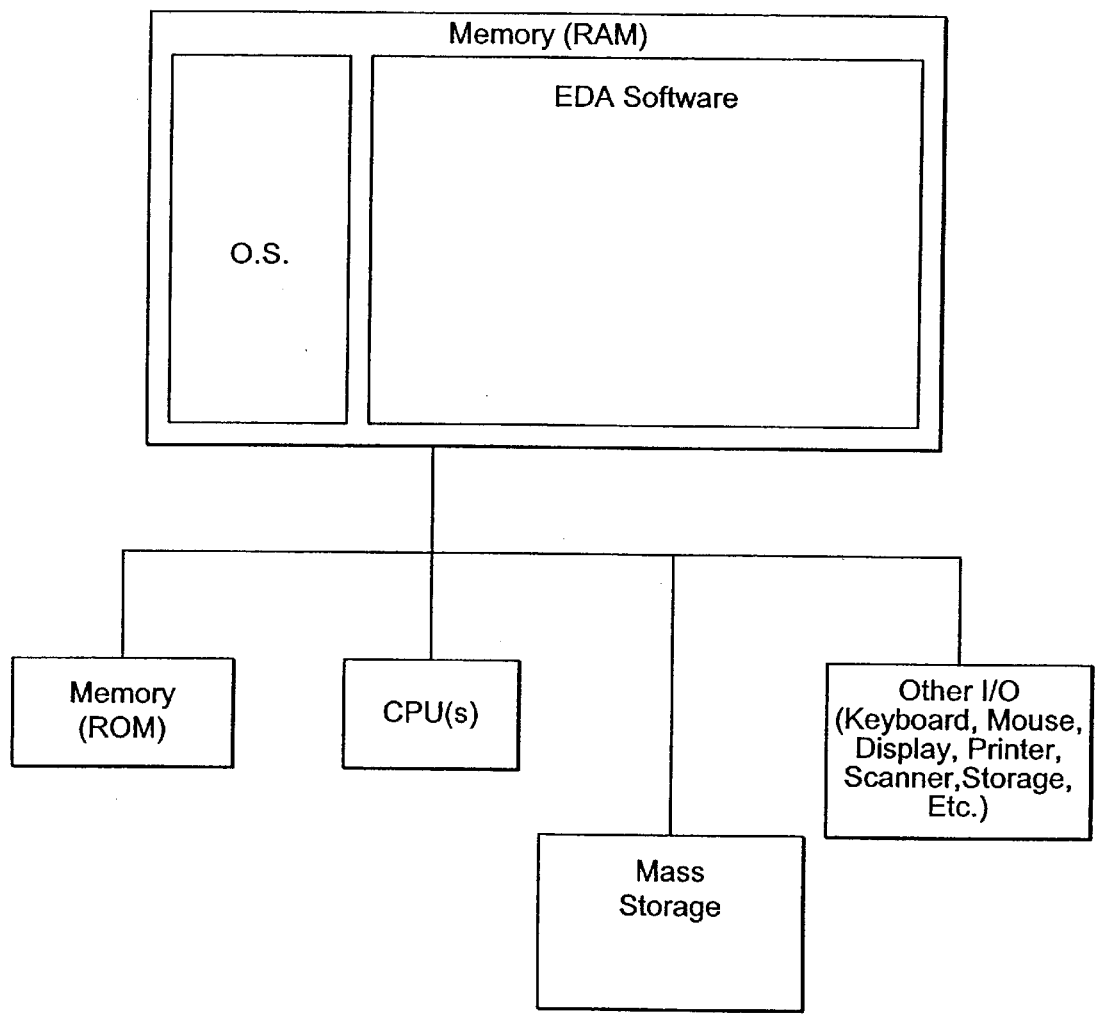
FIG. 8 is a block diagram of a computer system that may be used to practice the present invention.

Referring to FIG. 8, a diagram is shown of a computer system that may be used to practice the present invention. Attached to a system bus are one or more CPUs, read-only memory (ROM), read/write memory (RAM), mass storage, and other I/O devices. The other I/O devices will typically include a keyboard, a pointing device, and a display, and may further include any of a wide variety of commercially-available I/O devices, including, for example, magnetic storage devices, optical storage devices, other storage devices, printers, etc. Stored within memory (e.g., RAM) is software (e.g., EDA software) implementing methods of the type previously described.

Updating the timing graph is a computationally intensive operation. By carrying out this update on a multiprocessor, significant speedup can be achieved. Various different strategies may be used for defining threads of computation, where the threads are then individually scheduled on a set of available processors. Three such strategies will be described, using the following terminology.

A connected component of a timing graph is a subgraph consisting of a set of nodes and edges such that there is a path between any two nodes in this subgraph obtained by traversing the edges in either forward or backward direction.

A maximally connected component is a connected component to which no other nodes or edges can be added.

A timing end point of a timing graph is a node which has no output edges.

A timing start point of a timing graph is a node which has no input edges.

An input cone of a node n in the timing graph is a subgraph consisting of the set of all the nodes and edges between them for which there exists a path to n by following edges only in the forward direction.

An output cone of a node n in the timing graph is a subgraph consisting of the set of all the nodes and edges between them for which there exists a path to n by following edges only in the backward direction.

A thread of control is a sequence of instructions that can be scheduled on a processor and potentially execute in parallel with any other such sequence.

A lock may be placed on a data object by a thread to prevent it from being accessed by any other thread. If a data object is locked by a thread A, and is subsequently needed by thread B, then B must wait to access this object until A releases the lock.

The arrival time parameter is the latest time the signal value is stable at a node in the timing graph. This is computed forwards through the timing graph, i.e. starting at the timing start points and ending at the timing end points.

The required time parameter is the latest time the signal value is required at a node in the timing graph in order to meet the timing constraints. This is computed backwards through the timing graph, i.e. starting at the timing end points and ending at the timing start points.

Figure 9:
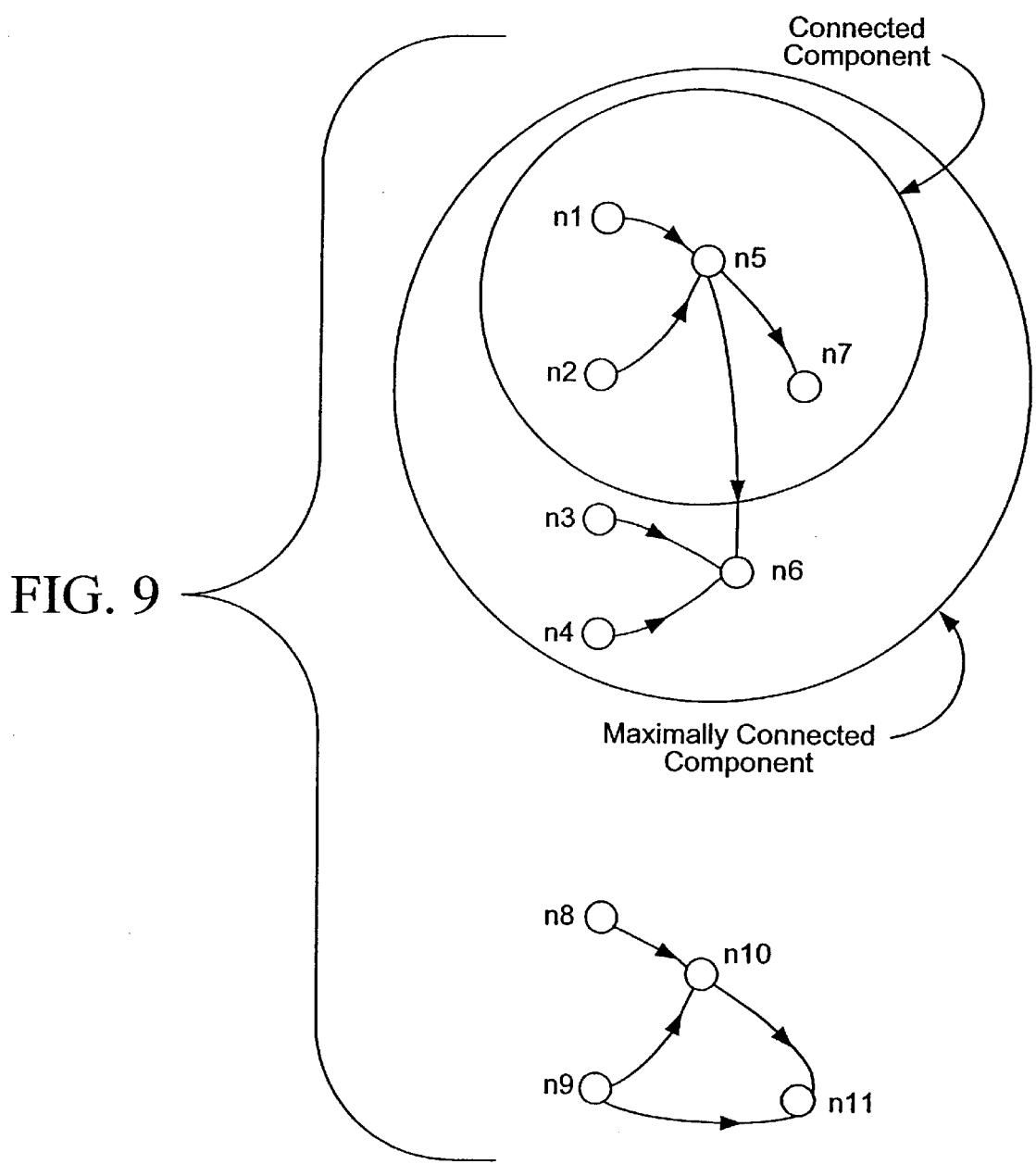
FIG. 9 is an example of a timing graph.

The foregoing definitions are illustrated by FIG. 9 in conjunction with the following table:

| Timing End Points | n1, n2, n3, n4, n8, n9 |
| Timing End Points | n7, n6, n11 |
| Input Cone of n6 | n1, n2, n3, n4, n5 |
| Output Cone of n1 | n5, n7, n6 |

In a first strategy, the timing update of each maximally connected component is done in a separate thread. Note that there is no dependence of any timing information between two nodes that belong to different maximally connected components. Thus the computation for each thread can proceed independent of the others without needing to lock any objects. This strategy is especially useful when the communication cost between threads is very high, such as is the case for message passing parallel computer systems.

In a second strategy, arrival time update for the entire input cone for each timing end point is a separate thread.

Similarly, required time update for the entire output cone for each timing end point is a separate thread.

This process may be described in terms of its principal steps. A node to be updated is visited (Step 1). All its children are recursively updated (Step 2; for the arrival time update the children are the nodes with incoming arcs to this node; for the required time update the children are the nodes with outgoing arcs from this node.) Finally the node itself is updated (Step 3). The recursion stops at the end of the cone when there are no more children to visit.

Unlike the case for maximally connected components, in this case a node may be visited by more than one thread since it can belong to several cones. Thus, there is a need to provide some locking mechanism to avoid contention between threads for access to a single data structure representing a node.

One possible locking mechanism may be termed coarse grain locking. In accordance with this mechanism, when a node that is in more than one cone is visited by a thread (Step 1), it is locked by that thread. The lock is released only when the timing updates have been done (after Step 3). As a consequence of this locking, each node in the timing graph is visited only once.

Another possible locking mechanism is fine grain locking. In accordance with this mechanism, a node is only locked when it is actually being updated (Step 3 above). As a consequence it may be possible for two threads to visit the same node (Steps 1 and 2), even though only one of them will be updating it (Step 3). In some situations, this method can potentially result in extra work for the second thread. However for this situation to happen, the second thread must visit the node after the first thread has visited it and before it has updated it, which is not likely to happen very often.

The described lazy update scheme balances the need for accuracy in the slack information with the computational cost of updating the timing graph. The need for such a lazy update scheme is increasing due to two aspects of new deep submicron technology. First, the number of cells in circuits is growing rapidly, resulting in large timing graphs. Second, logic synthesis, placement and routing modifications all contribute significantly to changes in timing information in new deep submicron technologies; consequently the number of updates to the timing information is very large, resulting in slow updates. Inability to accurately maintain the timing graph with reasonable computational requirements can cripple the design process. Lazy update becomes especially powerful when coupled with update techniques that take advantage of parallel processing capabilities.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of updating a timing graph representing timing information of an integrated circuit design, nodes of the timing graph representing elements within the integrated circuit and edges of the timing graph representing delays between elements of the integrated circuit, the method comprising steps of:

making modifications to the integrated circuit design;

computing a measure of changes in timing parameters for edges in the timing graph directly affected by said modifications;

when the measure exceeds a threshold, updating the edges in the timing graph that need to change in response to said modifications, otherwise continue to use the current edges in the timing graph; wherein said updating including updating multiple nodes substantially simultaneously using parallel processing techniques; and wherein the threshold is set in accordance with accuracy and efficiency requirements of an electronic design automation tool.

2. The method of claim 1, wherein said elements are at least one of gates and pins.

3. The method of claim 1, comprising the further steps of:

identifying multiple maximally-connected components of the timing graph; and creating separate process threads to simultaneously update nodes within the multiple maximally-connected components.

4. The method of claim 1, comprising the further steps of:

identifying multiple cones of the timing graph; and creating separate process threads to simultaneously update nodes within the multiple cones.

5. The method of claim 4, wherein the cones are input cones.

6. The method of claim 4, wherein the cones are output cones.

7. The method of claim 4, comprising the further steps of:

identifying nodes belonging to multiple cones; and when a process thread visits a node belonging to multiple cones, locking the node so that it cannot be visited by another process thread until the lock is released.

8. The method of claim 4, comprising the further steps of:

identifying nodes belonging to multiple cones; and when a process thread updates a node belonging to multiple cones, locking the node so that it cannot be updated by another process thread until the lock is released.

9. The method of claim 1, wherein the modifications are placement modifications.

10. The method of claim 1, wherein the modifications are logic modifications.

11. The method of claim 1, wherein the modifications are routing modifications.

12. The method of claim 1, wherein computing the changes in timing parameters for edges in the timing graph includes counting the number of changes.

13. The method of claim 1, wherein computing the changes in timing parameters for edges in the timing graph includes computing a cumulative change in at least one predetermined timing parameter.

14. The method of claim 13, wherein said at least one predetermined timing parameter is slack.

15. The method of claim 1, wherein at least some of the edges in the timing graph have associated slack values, the method comprising the further steps of:

sorting slack values; and assigning slack values to slack bins;

wherein the changes in timing parameters for edges in the timing graph is computed in accordance with how slack values in various bins have been changed.

16. The method of claim 15, wherein a total sum of allowable slack changes in each bin without requiring update is separately determined for at least some of said bins.

17. A method of using a timing graph to represent timing information of an integrated circuit design comprising cells having input terminals and output terminals and having interconnections between output terminals and input terminals of various ones of the cells, the method comprising steps of:

using each of a multiplicity of edges in the timing graph to represent an input-to-input delay from an input terminal of one cell to an input terminal of a succeeding interconnected cell, the delay being a combination of cell delay and interconnect delay;

changing at least one of cell speeds, cell positions, and interconnect lengths in the integrated circuit design; and updating the edges in the timing graph representing the input-to-input delays that need to change in response to said changing only in the event a threshold set in accordance with accuracy and efficientcy requirements has been exceeded, otherwise continuing to use the edges in the timing graph existing prior to said changing, wherein said updating including updating multiple nodes substantially simultaneously using parallel processing techniques.

18. A computer readable medium including instructions for updating a timing graph representing information of an integrated circuit design, nodes of the timing graph representing elements within the integrated circuit and edges of the timing graph representing delays between elements of the integrated circuit, including instructions for:

making modifications to the integrated circuit design;

computing a measure of changes in timing parameters for edges in the timing graph directly affected by said modifications; and when the measure exceeds a threshold, updating the edges in the timing graph that need to change in response to said modifications, otherwise continue to use the current edges in the timing graph; wherein said updating including updating multiple nodes substantially simultaneously using parallel processing techniques; and wherein the threshold is set in accordance with accuracy and efficiency requirements of an electronic design automation tool.

19. The computer-readable medium of claim 18, wherein said elements include at least one of gates and pins.

20. A system for designing integrated circuits, wherein a timing graph is used to represent timing information of an integrated circuit design, nodes of the timing graph representing elements within the integrated circuit and edges of the timing graph representing delays between elements of the integrated circuit, comprising:

means for making modifications to the integrated circuit design;

means for computing a measure of changes in timing parameters for edges in the timing graph directly affected by said modifications; and means for, when the measure exceeds a threshold, updating the edges in the timing graph that need to change in response to said modifications, otherwise continue to use the current edges in the timing graph; wherein said updating including updating multiple nodes substantially simultaneously using parallel processing techniques; and wherein the threshold is set in accordance with accuracy and efficiency requirements of an electronic design automation tool.

21. The system of claim 20, wherein said elements include at least one of said gates and pins.

22. A computer readable medium including instructions for using a timing graph to represent timing information of an integrated circuit design comprising cells having input terminals and output terminals and having interconnections between output terminals and input terminals of various ones of the cells, including instructions for:

storing a timing graph in which each of a multiplicity of edges represent an input-to-input delay from an input terminal of one cell to an input terminal of a succeeding interconnected cell, the delay being a combination of cell delay and interconnect delay;

changing at least one of cell speeds, cell positions, and interconnect lengths in the integrated circuit design; and updating the edges in the timing graph representing the input-to-input delays that need to change in response to said changing only in the event a threshold set in accordance with accuracy and efficientcy requirements has been exceeded, otherwise continuing to use the edges in the timing graph existing prior to said changing, wherein said updating including updating multiple nodes substantially simultaneously using parallel processing techniques.

23. Apparatus for using a timing graph to represent timing information of an integrated circuit design comprising cells having input terminals and output terminals and having interconnections between output terminals and input terminals of various ones of the cells, the method comprising steps of:

means for storing a timing graph in which each of a multiplicity of edges represent an input-to-input delay from an input terminal of one cell to an input terminal of a succeeding interconnected cell, the delay being a combination of cell delay and interconnect delay;

means for changing at least one of cell speeds, cell positions, and interconnect lengths in the integrated circuit design; and means for updating the edges in the timing graph representing the input-to-input delays that need to change in response to said changing only in the event a threshold set in accordance with accuracy and efficientcy requirements has been exceeded, otherwise for continuing to use the edges in the timing graph existing prior to said changing, wherein said updating including updating multiple nodes substantially simultaneously using parallel processing techniques.

* * * * *